United States Patent

[11] 3,615,942

[72] Inventors Martin Albert Blumenfeld
Somerville;
Kurt Jaques Sonneborn, Bound Brook,
both of N.J.
[21] Appl. No. 830,822
[22] Filed June 5, 1969
[45] Patented Oct. 26, 1971
[73] Assignee RCA Corporation

[54] METHOD OF MAKING A PHOSPHORUS GLASS PASSIVATED TRANSISTOR
6 Claims, 7 Drawing Figs.

[52] U.S. Cl. ........ 148/187, 29/576, 29/578, 148/188
[51] Int. Cl. ........ H01l 7/44
[50] Field of Search ........ 148/187, 188; 29/576, 578

[56] References Cited
UNITED STATES PATENTS

| | | | |
|---|---|---|---|
| 3,279,963 | 10/1966 | Castrucci et al. .......... | 148/188 |
| 3,391,035 | 7/1968 | Mackintosh .......... | 148/189 |
| 3,457,125 | 7/1969 | Kerr .......... | 148/187 |
| 3,507,716 | 4/1970 | Nishida et al. .......... | 148/187 |

*Primary Examiner*—L. Dewayne Rutledge
*Assistant Examiner*—R. A. Lester
*Attorney*—Glenn H. Bruestle

ABSTRACT: Phosphosilicate glass is incorporated in the passivating oxide on the surface of a diffused planar bipolar transistor by the steps of (1) forming a masking coating over a diffused base region in a body of semiconductive material; (2) depositing phosphosilicate glass on the surface of the device to form a shallow, highly doped emitter region in said base region; (3) depositing a protective silicon dioxide coating by the pyrolysis of silane ($SiH_4$) on the phosphosilicate glass, and (4) coating the silicon dioxide coating with photoresist and photolithographically removing a portion of all of the coatings down to the silicon surface adjacent to the emitter.

Figure 1:
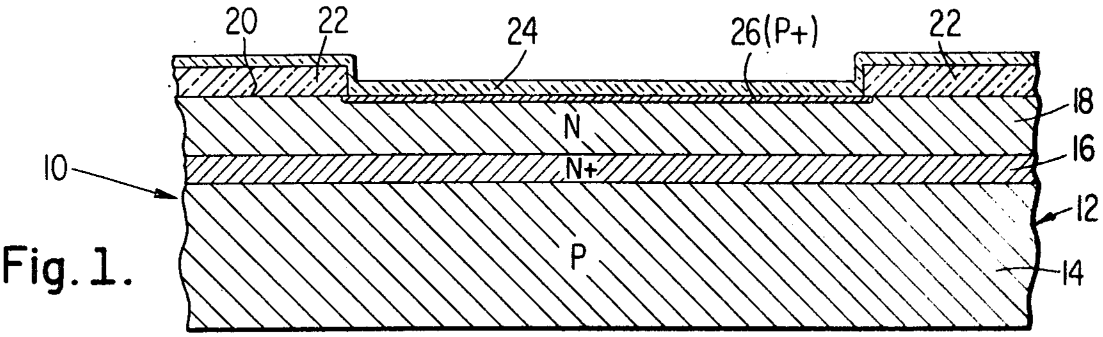
Figure 2:
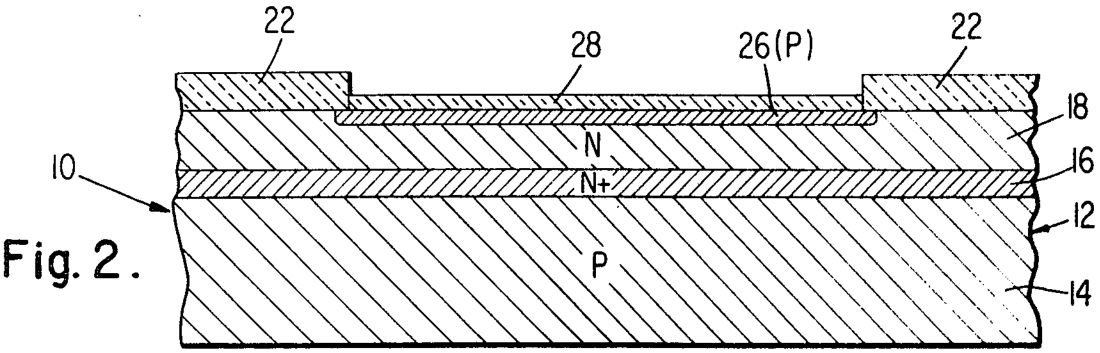

INVENTORS
Martin Albert Blumenfeld and
Kurt Jaques Sonneborn
BY [signature]
ATTORNEY INVENTORS
Martin Albert Blumenfeld and
Kurt Jaques Sonneborn.

BY Robert P. Williams
ATTORNEY

METHOD OF MAKING A PHOSPHORUS GLASS PASSIVATED TRANSISTOR

BACKGROUND OF THE INVENTION

This invention relates to the manufacture of transistors.

Planar bipolar transistors are conventionally fabricated by a process which includes the diffusion of regions of mutually opposite type conductivity into a body of semiconductive material to form NPN or PNP structures. The sites of the diffused regions are defined by known photolithographic techniques. In the manufacture of silicon devices, the diffusions are usually carried out by a two step process in which the semiconductor is first heated in an ambient containing a conductivity modifying impurity and oxygen so that a shallow highly doped diffused region is formed in the device and a glassy coating is formed on the surface of the device. This coating protects the underlying semiconductor surface against evaporation or chemical reaction and also acts as an intermediate impurity source between the original impurity source and the semiconductive body. After this deposition step, the glassy coating is removed and the device is further heated, in steam or some other oxidizing ambient, to cause redistribution of the conductivity modifying impurities from the shallow region to a desired depth and to cause reoxidation of the semiconductor surface.

In silicon transistors, phosphorus is conventionally employed as a donor impurity. The deposition of this impurity in an oxidizing ambient results in the formation of a coating of an amorphous mixture of silicon dioxide ($SiO_2$) and phosphorus pentoxide ($P_2O_5$), i.e., a phosphosilicate glass, on the surface of the silicon. It has been found that transistors which are made in such a way that the phosphosilicate glass coating which is formed during the emitter deposition is retained on the device are less sensitive to elevated temperature and biasing voltages than those which do not have such a coating. A theoretical explanation of the effect of a phosphosilicate layer on a bipolar transistor is given by Kerr et al., *Stabilization of $SiO_2$ Passivation Layers with $P_2O_5$*, IBM Journal of Research and Development, Sept. 1964, at pages 376 to 384.

The results obtained in prior devices formed in the manner taught by Kerr et al. have been unpredictable. The degree of passivation is apparently related to the thickness of the phosphosilicate glass layer and this is difficult to control, because the glass layer is affected by an etching treatment used just prior to the deposition of the contact metallization to lower the contact resistance. This treatment removes some or all of the phosphosilicate glass.

Heretofore, phosphosilicate glass has not been included in the passivating coating on transistors which are intended to be operated at high frequencies. These transistors have been fabricated with extremely small emitter dimensions. The conventional emitter redistribution step has been omitted from the fabrication of these devices because, if the small emitter sites are reoxidized, it is then necessary to photoetch contact openings, It is not possible to align the photomask used to define those emitter contact openings with sufficient accuracy to insure that only emitter material is exposed. Consequently, in these devices, the shallow region formed during the deposition step has been utilized as the emitter region. Accurate contact openings can be made by simply removing the phosphosilicate glass formed during the emitter deposition. Consequently, after the contact openings are formed, no phosphosilicate glass remains on the devices.

SUMMARY OF THE INVENTION

The present method provides for the fabrication of phosphosilicate glass passivated bipolar transistors useful at high frequencies which are free of problems of the prior art. The present method includes the steps of forming nonreoxidized emitter region in a base region within a body of semiconductive material with the resultant formation of a layer of phosphosilicate glass on the device and then coating the phosphosilicate glass layer with a protective coating. After the protective coating step, appropriate contact openings are formed by the photolithographic removal of the protective coating over the phosphosilicate glass at the emitter site by means of an etchant which is selective for the protective coating and the glass and which will not attack a thermal oxide coating.

THE DRAWINGS

FIG. 1 to 6 are a series of cross-sectional views illustrating the steps in the present process.

THE PREFERRED EMBODIMENT

The cross-sectional structure of a partially processed wafer prior to the performance of the novel steps of the present method is shown in FIG. 1. The wafer, generally designated by the numeral 10, includes a body 12 of semiconductive material, such as silicon, which has been provided by conventional means and processes with a lower supporting portion 14, of P-type conductivity in this example, an intermediate N+type portion 16, and an upper N-type portion 18 of the proper resistivity to serve as a transistor collector. Conventionally, the N-type portion 18 is an epitaxial layer grown on the surface of the N+type portion 16. The body 12 has an upper surface 20 upon which the diffusion operations for the fabrication of a transistor may be performed.

The configuration illustrated in FIG. 1 exists after the impurity deposition step of a base diffusion. Prior to the deposition itself, a diffusion masking coating 22 is formed on the surface 20 of the body 12. This coating 22, which is typically of silicon dioxide, is formed in conventional manner by heating the body 12 in an oxidizing ambient to form a genetic oxide coating of silicon dioxide. Thereafter, a portion of the coating 22 is removed by known photoetching techniques to expose that portion of the surface 20 which is intended to be occupied by the base region of the device.

After the completion of the photoetching step, the body 12 is placed in a furnace in an atmosphere containing an acceptor impurity, typically boron, and oxygen, for a time and at a temperature sufficient to produce a coating of borosilicate glass 24 on the surface 20 and over the exposed surfaces of the coating 22. This deposition step also results in the formation of a diffused region 26 in the layer 18 beneath the surface 20 of the body 12. At this stage of the processing, the region 26 is shallow and of P+type conductivity.

A base redistribution step is next performed. The borosilicate glass coating 24, FIG. 1, is first removed from the wafer 10 in a suitable solvent and the wafer 10, without the coating 24, is disposed in a furnace in an atmosphere of steam, or some other oxidizing ambient at a temperature typically around 1100° C. so that further diffusion of the acceptor impurities in the region 26 takes place. At the same time, the exposed surface of the device 10 is oxidized to form a new masking oxide coating 28 (FIG. 2), and the masking oxide coating 22 increases in thickness. The time of the redistribution is controlled and selected to cause the base region 26 to diffuse to a desired depth within the region 18.

Figure 3:
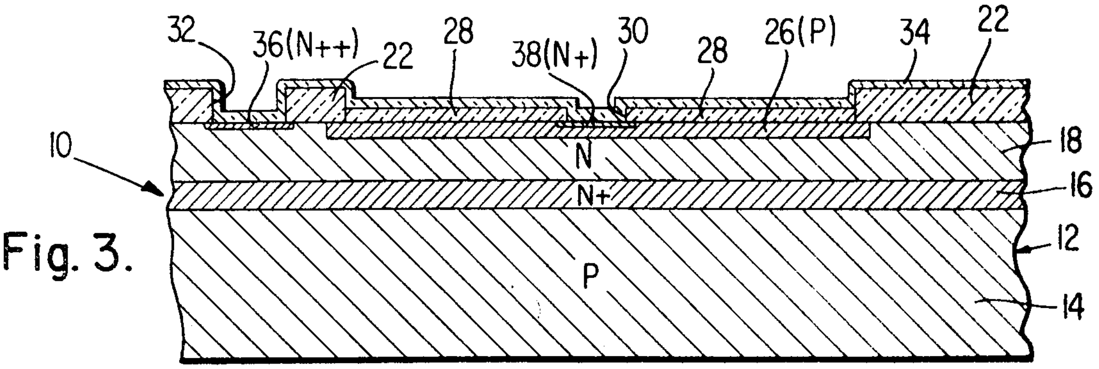

Upon completion of the base redistribution step, conventional photolithographic processes are employed to provide openings in the masking oxide coatings 28 and 22 at the emitter site and at a site adapted to provide contact to the collector region. Thus, as shown in FIG. 3, there is an opening 30 which defines the emitter site and an opening 32 through the masking oxide coating 22 which defines the collector contact site.

The wafer 10 is next placed in a furnace in an ambient containing phosphorus and oxygen for a time and at a temperature sufficient to form a phosphosilicate glass coating 34 (FIG. 3) over all of the exposed upper surfaces of the masking oxide coating 22 and the base oxide coating 28 and in the openings 30 and 32. For example the wafer 10 may be heated to a temperature of between 650° C. and 950° C. in an ambient containing oxygen and phosphorus which may be derived from bubbling nitrogen through a liquid phosphorus oxychloride bath. The time of deposition is not critical, but should range from about 5 to about 30 minutes to achieve a phosphosilicate glass coating 34 ranging from 200 to 2000 A. in thickness. As another example, the coating 34 may be produced by the pyrolysis of a mixture of silane ($SiH_4$) and phosphine ($PH_3$) in oxygen. This process is advantageous in that it can be carried out at a relatively low temperature of about 300° C.

The deposition of the phosphosilicate glass coating 34 also results in the formation of a highly doped N30+region 36 which serves to aid in making ohmic contact to the collector region 18 and a highly doped N+type region 38 which constitutes the emitter of the device.

All of the steps described thus far are known in the art and are used in the manufacture of planar bipolar transistors. The steps to be described hereinafter constitute a departure from, and novel process in combination with, these steps.

Figure 4:
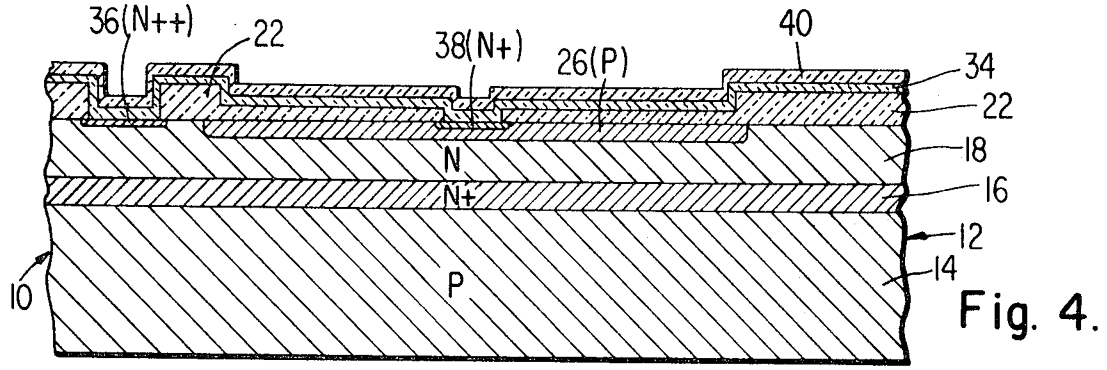

Conventionally, the phosphosilicate glass layer formed during the emitter deposition is removed to open the emitter contact. However, in the present process, this step is omitted and there is no phosphorus glass removal. Instead, the next step, illustrated in FIG. 4, is to provide a protective coating 40 over the phosphosilicate glass coating 34. In the present process, this protective coating 40 is preferably of phosphorus -doped silicon dioxide. The deposition of the coating 40 is preferably carried out by heating the wafer 10 in an atmosphere of silane ($SiH_4$) and phosphine ($PH_3$) in oxygen. This process can be carried out at a relatively low temperature of about 300° C. and the depth of the emitter region 38 and the base region 26 is not appreciably affected thereby. A phosphorus-doped silicon dioxide coating made by this process has a relatively low density and it is preferable to anneal it in an oxidizing atmosphere. Accordingly, the next step in the present process is to heat the wafer 10 in steam, or some other oxidizing ambient for example, for a time sufficient to increase the density of the coating 40 to a desire value.

The next step in the present process is to provide openings through the phosphorus-doped silicon dioxide layer 40 and the phosphosilicate glass layer 34 to the surface of the wafer 12 to permit contact to be made to the emitter and collector regions of the device. For this purpose, the surface of the silicon dioxide coating 40 is first treated with a substance such as benzene sulfonic acid, inasmuch as it has been found that conventional photoresists will not adhere well to this material without such treatment. A photoresist material is then applied over the entire surface of the wafer 10.

Figure 5:
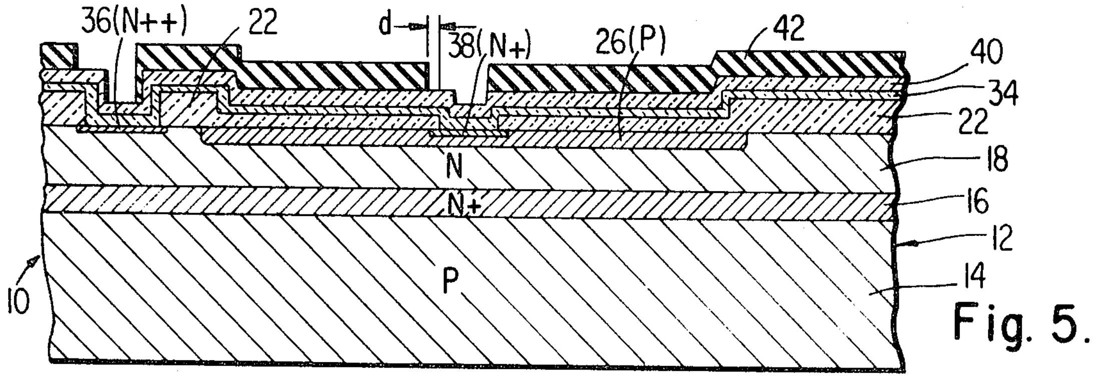

A mask is used to expose the photoresist 42. This mask produces a pattern in the photoresist which may be the same size as the emitter and collector openings or smaller or larger than these openings after exposure. Precise alignment of the mask over the emitter and collector sites is not necessary because the time required to remove the phosphorus-doped oxide coating 40 and the phosphosilicate glass layer 34 is short because these materials may be easily etched. As illustrated in FIG. 5, the openings produced in the photoresist 42 may be displaced by a small distance "d" from the position they should occupy in exact alignment over the emitter and collector contact sites.

Figure 6:
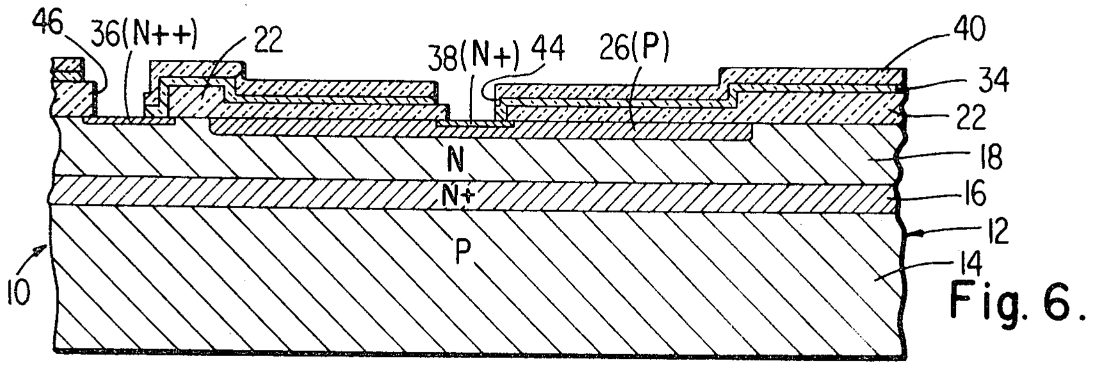
Figure 7:
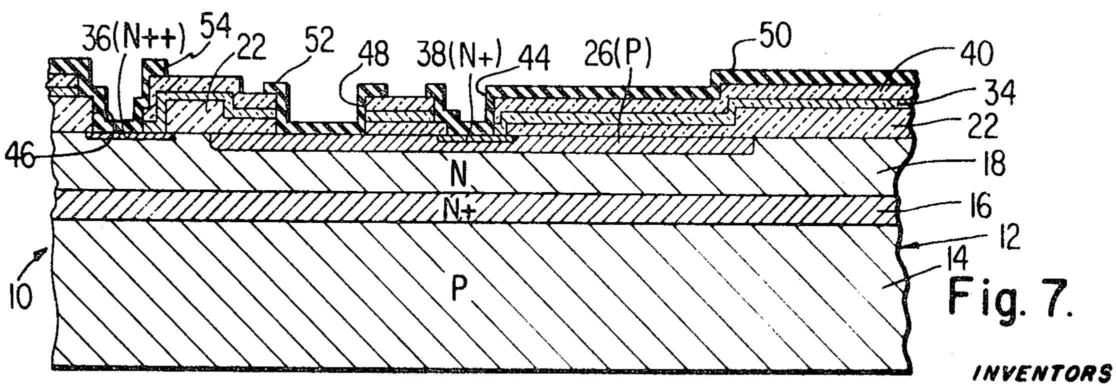

The wafer is next placed in an etching bath, such as hydroflouric acid buffered with ammonium fluoride to remove those portions of the phosphorus-doped oxide coating 40 and the phosphosilicate glass coating 34 which are not protected by the photoresist coating 42. The resulting structure after the photoresist has been removed in a suitable solvent is shown in FIG. 6, illustrating an emitter contact opening 44 and a collector contact opening 46. It will be observed that the etching treatment removes the phosphorus-doped oxide and the phosphosilicate glass but does not attack the original masking oxide coating 28 and 22 because these coatings are not as easily etched by the phosphosilicate glass etching material. From this point on, the fabrication of the device may follow standard techniques. Thus, a new photoresist coating (not shown) may be applied to the device as it is shown in FIG. 6, and a suitable contact opening 48 (Fig. 7) to the base region 26 provided. Then, the emitter, base, and collector metallization indicated at 50, 52 and 54 respectively may be applied in known manner.

The device as fabricated by the present method includes a layer of phosphorus-doped silicon dioxide and a layer of phosphosilicate glass for device stability and a nonreoxidized emitter region for improved high frequency performance. The emitter base junction is well protected by the original thermally grown masking oxide coating and there is little likelihood of emitter base shorts when the present method is followed.

We claim:

1. In an improved method of making a transistor including a body of semiconductive material with a collector region of N-type conductivity, a base region of P-type conductivity, and an emitter region formed within said base region by a process including the deposition of a phosphosilicate glass layer onto said body and onto a masking oxide coating on said body, said masking oxide coating having an aperture which defines the location of said emitter region, the improvement comprising removing only a portion of said phosphosilicate glass layer from said body, said portion being substantially aligned with said aperture in said masking oxide coating, said removing step including the steps of forming a protective coating of a material which can be etched by a substance which will also etch said phosphosilicate glass coating but not said masking oxide coating over said phosphosilicate glass coating, forming a coating of a photoresist material on said protective coating, and exposing said photoresist coating through a mask having an emitter pattern to define an opening in said photoresist coating which is substantially aligned with said aperture in said masking oxide coating.

2. An improved method making a phosphosilicate glass passivated transistor of the nonreoxidized emitter type in a body of semiconductive material including a base region of P-type conductivity, a collector region of N-type conductivity, a masking oxide coating over said base region and having an aperture therein which defines an emitter site, and a shallow diffused N-type emitter region formed in said P-type base region by the deposition of a phosphosilicate glass coating onto said body and extending through said aperture in said masking oxide coating, wherein the improvement comprises after the deposition of said phosphosilicate glass coating and before the removal of any portion thereof, forming a protective coating of a material which can be etched by a substance which will also etch said phosphosilicate glass coating but not said masking coating over said phosphosilicate glass coating, and selectively etching said protective coating in the vicinity of said aperture in said masking oxide coating to expose the material of said emitter region.

3. An improved transistor making method as defined in claim 2 wherein said selective etching step includes the steps of forming a photoresist coating on said protective coating, and exposing said photoresist coating through a mask having a pattern corresponding to the size and shape of said emitter region to define an opening in the said photoresist coating which is substantially, and not necessarily exactly, aligned with said apertures in said oxide coating.

4. A method of fabricating a phosphosilicate glass passivated transistor in a body of semiconductive material of one type conductivity having a surface, a region of conductivity-type opposite to that of said body in said body adjacent to said surface, and a diffusion masking coating on said surface over said region of opposite type conductivity, said diffusion masking coating having an opening therein, said method comprising the steps of heating said body in an ambient containing phosphorus and oxygen for a time and at a temperature sufficient to form a phosphosilicate glass coating on the surface of said diffusion masking coating and on the surface of said body within said opening, forming a protective coating of a material which can be etched by a substance which will also etch said phosphosilicate glass coating but not said masking coating over said phosphosilicate glass coating, and selectively etching said protective coating and said phosphosilicate glass coating in the vicinity of said opening in said masking oxide coating to expose the material of said body.

5. A method making a phosphosilicate glass passivated transistor as defined in claim 4 wherein said protective coating is phosphorus doped silicon dioxide.

6. A transistor making method as defined in claim 5 wherein said protective coating is formed by heating said body in an ambient of silane ($SiH_4$) and phosphine ($PH_3$) for a time and at a temperature sufficient to form a coating of predetermined thickness.